United States Patent [19]

Bobeck

[11] 4,181,978
[45] Jan. 1, 1980

[54] MAGNETIC BUBBLE MEMORY WITH EXPANDER-DETECTOR ARRANGEMENT

[75] Inventor: Andrew H. Bobeck, Chatham, N.J.

[73] Assignee: Bell Telephone Laboratories, Incorporated, Murray Hill, N.J.

[21] Appl. No.: 899,577

[22] Filed: Apr. 24, 1978

[51] Int. Cl.² .............................................. G11C 19/08
[52] U.S. Cl. .................................... 365/8; 365/19; 365/43
[58] Field of Search ........................... 365/8, 19, 20, 43

[56] References Cited

U.S. PATENT DOCUMENTS

| | | | |
|---|---|---|---|
| 3,702,995 | 11/1972 | Bobeck et al. | 365/8 |
| 3,967,002 | 6/1976 | Almasi et al. | 365/8 |
| 4,067,002 | 1/1978 | Chang | 365/43 |

*Primary Examiner*—James W. Moffitt
*Attorney, Agent, or Firm*—Herbert M. Shapiro

[57] ABSTRACT

An expander-detector arrangement for a conductor-access, magnetic bubble memory is realized by the inclusion in an electrically-conducting layer in which bubble propagation currents are impressed sets of apertures operative to enlarge a bubble laterally. For this purpose increasingly greater numbers of apertures are arranged laterally with respect to the axis of bubble movement through successive stages of the expander-detector arrangement. The actual detector is formed at the stage including the maximum number of apertures.

6 Claims, 4 Drawing Figures

MAGNETIC BUBBLE MEMORY WITH EXPANDER-DETECTOR ARRANGEMENT

BACKGROUND OF THE INVENTION

Magnetic bubble memories are now well known in the art. One mode of moving bubbles in such a memory is called the field-access mode and is described in A. H. Bobeck U.S. Pat. No. 3,534,347, issued Oct. 13, 1970. Such a memory is characterized by a pattern of magnetic elements typically magnetically soft permalloy, in a plane adjacent the bubble layer. The elements respond to a magnetic field reorienting in the plane of the bubble layer to generate changing magnetic pole patterns. The poles produce field gradients in the bubble layer for moving bubbles along paths defined by the pattern of elements.

The pattern of elements typically also defines what is commonly termed an expander-detector. U.S. Pat. No. 3,810,132 of A. H. Bobeck, issued May 7, 1974, describes such an arrangement in which closely spaced chevron-shaped permalloy elements define an arrangement operative to expand bubbles laterally with respect to the path of propagation. To this end, successive stages of the expander-detector include increasingly greater members of elements. The stage with the maximum number of elements includes a magnetoresistive element, also of permalloy, interlinking the chevrons of that stage. The usual field-access circuit includes a guard rail, defined also by chevron-shaped elements, operative in response to the rotating magnetic field.

Copending application, Ser. No. 899,578, filed Apr. 24, 1978 herewith for A. H. Bobeck and F. J. Ciak, describes a "field-access" bubble memory which employs a single layer of electrically conducting material. The layer includes a pattern of apertures and is responsive to a substantially uniform current flow in successively radially-reorienting directions to generate magnetic field-gradients for moving bubbles in an adjacent bubble layer. This organization is a field-access arrangement in every sense of the term but requires no field coils common to field-access bubble memories.

The problem to which the present invention is directed is to achieve an expander-detector for such a memory with little additional processing.

BRIEF DESCRIPTION OF THE INVENTION

The solution was to provide in the electrically conducting layer a sequence of stages successive ones of which include increasingly greater numbers of chevron-shaped apertures. The chevron-shaped elements are not closely spaced in the sense employed with conventional field-access expander-detectors. This is because the apertures contour currents flowing between them. Thus, the conducting material to either side of a chevron-shaped aperture are "closely spaced" rather than adjacent "chevron elements" as is the case with the conventional structure. Nevertheless, the operation of the expander-detector herein is analogous to its permalloy counterpart.

It should be clear therefore that a magnetic bubble memory herein comprises a first layer of material in which magnetic bubbles can be moved, current-responsive means for moving magnetic bubbles from an input position to a detector stage and a multistage expander-detector arrangement operative to elongate a bubble in the layer wherein the current-responsive means comprises a second layer of electrically-conducting material coupled to the first layer and including a plurality of apertures therein for defining a multistage path of bubble propagation along an axis, wherein, also, the expander-detector arrangement comprises, in successive stages, increasingly greater numbers of apertures aligned laterally with respect to the axis.

DETAILED DESCRIPTION OF ILLUSTRATIVE EMBODIMENT OF THE INVENTION

Figure 1:
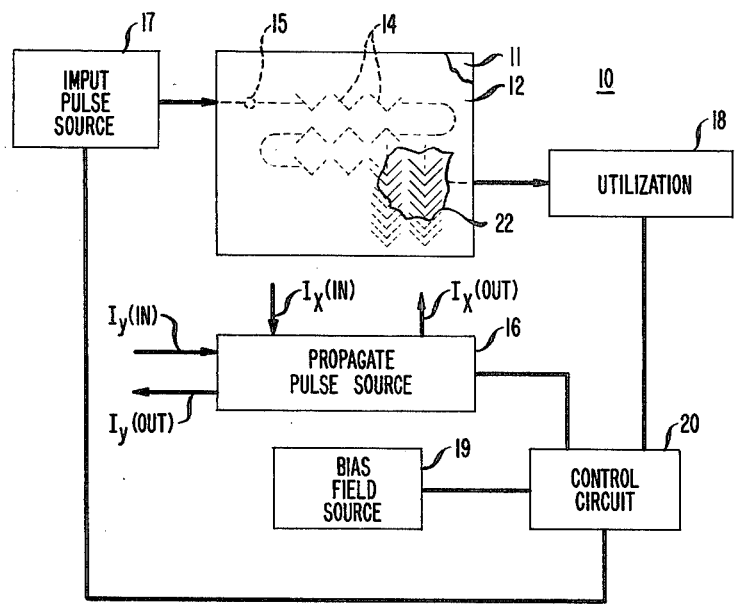
FIG. 1 is a schematic representation of a magnetic bubble memory in accordance with this invention.

FIG. 1 shows a magnetic bubble memory 10 including a layer 11 of material in which magnetic bubbles can be moved. A layer 12 of electrically conducting material typically aluminium 96% - copper 4% one-half to one micron thick, overlies layer 11. Apertures 14 are formed in layer 12. The apertures are shown to be chevron shaped for convenience although it is to be understood that apertures of a wide variety of shapes can be used as is consistent with the disclosure of the above-mentioned copending application of A. H. Bobeck and F. J. Ciak. The apertures are operative on current flow in layer 12 to contour the currents locally to generate magnetic field gradients in the adjacent bubble layer. As the current flow changes in orientation in the plane of layer 12, the apertures generate changing pole patterns to move bubbles.

The overall propagation operation for moving bubble patterns along a path from an input position 15 to an output position is disclosed in the above-mentioned copending application of A. H. Bobeck and F. J. Ciak. That operation is a result of a sequence of discrete (or sinusoidal) pulses $I_{y+}$, $I_{x+}$, $I_{y-}$, and $I_{x-}$ applied to layer 12 by a propagation pulse source represented by block 16 in FIG. 1. Suitable input sources and utilization circuits represented by blocks 17 and 18 are well known in the art.

The diameter of a bubble in the memory is maintained at a nominal value by a bias field antiparallel to the magnetization of a bubble. Such a field is supplied by well known means represented by block 19. The various sources and circuits are synchronized and controlled by a control circuit represented by block 20.

Figure 2:
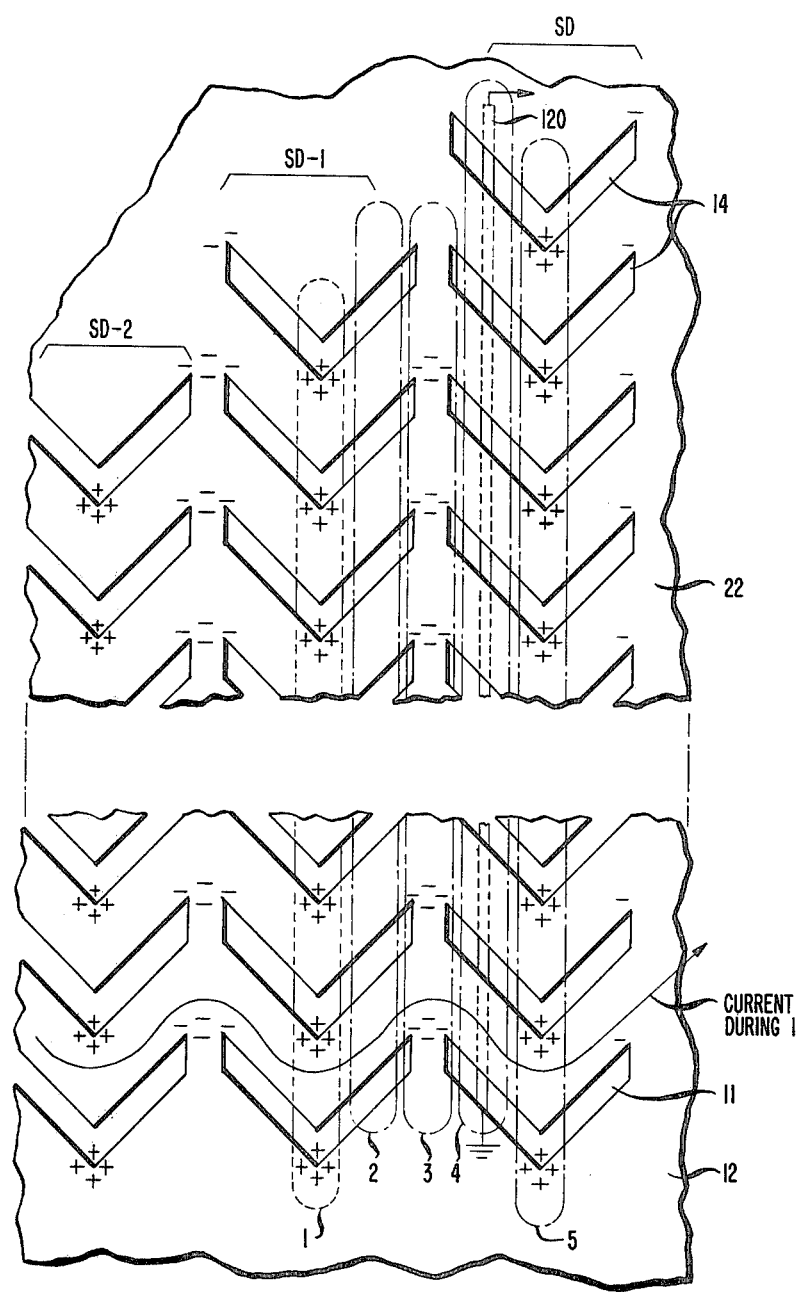
FIG. 2 is an enlarged top view of a portion of an expander-detector of an illustrative embodiment of this invention.

FIG. 2 shows a top view of a portion 22 of layer 12 of FIG. 1. It may be appreciated that, although in practice the numbers of elements in adjacent stage may differ greatly in the illustrative three stages $S_{D-2}$, $S_{D-1}$, and $S_D$ a representation with the numbers of chevrons in consecutive stages increase by one in each instance. It is to be understood that the actual number of apertures may reach one hundred in the detector stage $S_D$ where the detector element itself is placed. The detector is discussed hereinafter. First we shall discuss the generation of poles and the resulting domain movement in response to a pulse sequence from source 16 of FIG. 1.

Figure 3:
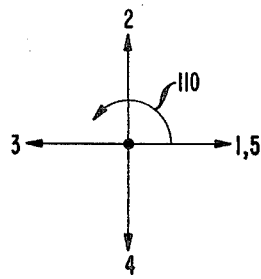
FIG. 3 is a current vector diagram for currents impressed for moving bubbles in the expander-detector of FIG. 2.
Figure 4:
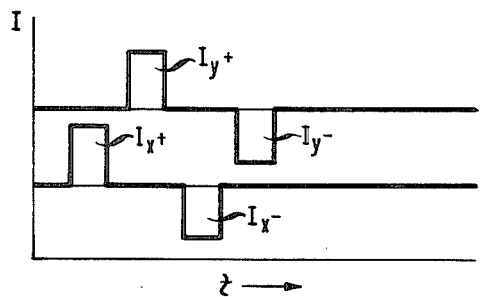
FIG. 4 is a pulse diagram of the operation of the memory of FIG. 1.

FIGS. 3 and 4 show a current vector and pulse diagram of the operation of the memory of FIG. 1. Four orientations for the current vector are shown in FIG. 3. The orientations correspond to the pulses $I_{x+}$, $I_{y+}$, $I_{x-}$, and $I_{y-}$ as shown in the pulse diagram of FIG. 1. Curved arrow 110 in FIG. 3 indicates that the current flow in layer 12 of FIG. 1 rotates counterclockwise in the plane of the layer. Plus and minus signs in FIG. 2 are illustrated for the current vector direction 1 in FIG. 3 only for positions where currents converge. Domain strips (elongated bubbles) are shown in sequential positions labeled 1, 2, 3, 4 and 5 to correspond to the designations of the current vectors in FIG. 3.

The elongated domains are assumed to be attracted to the positive signs. By use of the right-hand rule, the positive poles (signs) can be understood to occupy positions corresponding to positions 2, 3, 4, and 5 as the current vector reorients to the corresponding directions.

The similarity between the pattern of FIG. 2 and the familiar chevron expander common to permalloy field-access bubble memories is clear. But it should also be clear that the chevron patterns of FIG. 2 are apertures and not permalloy. The areas between the chevron elements of FIG. 2 carry currents which converge and diverge because of the chevron shaped cutouts. Field gradients generated by the so-contoured conductive layer produce the requisite field gradients. This is in contrast to the case with permalloy elements which become magnetized in response to a magnetic field reorienting in the plane of the bubble layer.

The spacings between chevron-shaped apertures of FIG. 2 and those of the look-alike permalloy chevron bubble expander differ also. The former spacing is sufficiently large to allow an adequate separation between convergent (and attracting) positions. Although negative signs are appropriate for several positions in the area occupied by the domain in position 1, those negative signs are in area where current flow diverges and thus would represent weak repulsive poles which appear to affect domain movement only negligibly. They are, therefore, not shown.

A thin film magnetoresistive detector 120 is formed underneath layer 12. Detector 120 responds to the presence of a bubble to apply a signal to utilization circuit 18 of FIG. 1 in a well understood manner. Of course, the elongated domain so detected is in practice 100 times as large as a bubble of nominal size in layer 11. Such domains are productive of a 5 millivolt signal typically.

What has been described is considered only illustrative of the principles of this invention. Accordingly, modifications of this invention in accordance with those principles can be devised by those skilled in the art within the spirit and scope thereof as encompassed by the following claims.

I claim:

1. A magnetic bubble memory comprising a first layer of material in which magnetic bubbles can be moved, current responsive means for moving magnetic bubbles from an input position to a detector stage, and a multistage expander-detector arrangement operative to elongate a bubble in said layer, said current responsive means comprising a second layer of electrically conducting material coupled to said first layer and including a plurality of apertures therein for defining a multistage path of bubble propagation along an axis, said expander-detector arrangement comprising in successive stages increasingly greater numbers of apertures aligned laterally with respect to said axis.

2. A magnetic memory in accordance with claim 1 wherein said apertures in said expander-detector arrangement are chevron shaped.

3. A magnetic memory in accordance with claim 1 wherein said detector stage includes a magnetoresistive detector.

4. A magnetic memory in accordance with claim 1 wherein said apertures penetrate said second layer.

5. A magnetic memory in accordance with claim 1 wherein said current responsive means includes means for impressing current pulses in said second layer in a sequence to reorient current flow in said second layer cyclically.

6. A magnetic bubble memory (10) comprising a first layer (11) of material in which a magnetic bubble can be moved, current responsive means (12, 14, 16) for moving magnetic bubbles from an input position (15) to a detector stage ($S_D$), the memory being characterized by a multistage expander-detector arrangement (FIG. 2) operative to elongate a bubble in said layer, the current responsive means comprising a second layer (12) of electrically-conducting material coupled to the first layer and including a plurality of apertures (14) for defining a multistage path of bubble propagation along an axis, the expander-detector arrangement comprising in successive stages increasingly greater numbers of apertures aligned laterally with respect to the axis.

* * * * *